(12) United States Patent
Furuyama et al.

(10) Patent No.: US 9,005,334 B2
(45) Date of Patent: *Apr. 14, 2015

(54) WATER-PROOF AIR-PERMEABLE FILTER AND USE OF THE SAME

(75) Inventors: Satoru Furuyama, Osaka (JP); Yozo Nagai, Osaka (JP); Junichi Moriyama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 79 days.

This patent is subject to a terminal disclaimer.

(21) Appl. No.: 13/702,833

(22) PCT Filed: Mar. 23, 2011

(86) PCT No.: PCT/JP2011/001698
§ 371 (c)(1),
(2), (4) Date: Dec. 7, 2012

(87) PCT Pub. No.: WO2011/158408
PCT Pub. Date: Dec. 22, 2011

(65) Prior Publication Data
US 2013/0074691 A1    Mar. 28, 2013

(30) Foreign Application Priority Data
Jun. 16, 2010   (JP) ................... 2010-136828

(51) Int. Cl.
*B01D 59/12* (2006.01)
*B01D 53/22* (2006.01)
(Continued)

(52) U.S. Cl.
CPC .............. *B01D 53/228* (2013.01); *B01D 46/54* (2013.01); *B01D 69/02* (2013.01); *B32B 3/266* (2013.01); *H05K 5/068* (2013.01); *B01D 39/1692* (2013.01); *B01D 39/16* (2013.01);
(Continued)

(58) Field of Classification Search
USPC .......................... 95/43, 45, 46, 47, 54; 96/4, 6
See application file for complete search history.

(56) References Cited

U.S. PATENT DOCUMENTS 4,161,948 A    7/1979   Bichon
4,459,139 A    7/1984   vonReis et al.
(Continued)

FOREIGN PATENT DOCUMENTS

JP    57-160617    10/1982
JP    60-038723 U    3/1985
(Continued)

OTHER PUBLICATIONS

Machine Translation of JP 09-132667 HARUO May 20, 1997.*

*Primary Examiner* — Jason M Greene
*Assistant Examiner* — Anthony Shumate
(74) *Attorney, Agent, or Firm* — Hamre, Schumann, Mueller & Larson, P.C.

(57) ABSTRACT

A water-proof air-permeable filter (1) includes: a resin film (2) having formed therein a plurality of through pores (21); and a treated layer (3) having hydrophobicity and oil repellency, and formed on at least one of both surfaces in the thickness direction of the resin film (2) such that the treated layer (3) has openings (31) at positions corresponding to the through pores (21). The through pores (21) each have a predetermined size larger than or equal to 0.01 μm and smaller than or equal to 10 μm, and are uniformly distributed such that a density of the through pores falls within specific limits included in a range from 10 to $1\times10^8$ pores/mm$^2$.

12 Claims, 1 Drawing Sheet

(51) Int. Cl.
  *B01D 46/54* (2006.01)
  *B01D 69/02* (2006.01)
  *B32B 3/26* (2006.01)
  *H05K 5/06* (2006.01)
  *B01D 39/16* (2006.01)
  *B01D 71/48* (2006.01)
  *B32B 5/32* (2006.01)
  *H05K 7/20* (2006.01)
  *B01D 67/00* (2006.01)

(52) U.S. Cl.
  CPC ............... *B01D 71/48* (2013.01); *B32B 5/32* (2013.01); *H05K 7/20* (2013.01); *B01D 67/0088* (2013.01); *B01D 2279/35* (2013.01); *B01D 2279/45* (2013.01); *B01D 2325/02* (2013.01); *B01D 2325/04* (2013.01); *B01D 2325/38* (2013.01); *B32B 2307/724* (2013.01); *B32B 2307/7265* (2013.01); *B01D 2239/0428* (2013.01); *B01D 2239/1216* (2013.01); *B01D 2323/04* (2013.01)

(56) References Cited

U.S. PATENT DOCUMENTS

| | | | |
|---|---|---|---|
| 4,521,212 A | 6/1985 | Ruschke | |
| 5,069,794 A * | 12/1991 | Haag et al. | 210/650 |
| 5,100,555 A | 3/1992 | Matson | |
| 5,215,554 A * | 6/1993 | Kramer et al. | 95/47 |
| 5,700,375 A * | 12/1997 | Hagen et al. | 210/651 |
| 5,955,175 A | 9/1999 | Culler | |
| 6,015,500 A | 1/2000 | Zuk | |
| 6,375,854 B2 | 4/2002 | Beplate | |
| 6,512,834 B1 | 1/2003 | Banter et al. | |
| 6,550,622 B2 | 4/2003 | Koslow | |
| 7,255,725 B2 * | 8/2007 | Chau et al. | 95/50 |
| 8,079,574 B2 | 12/2011 | Lin | |
| 8,523,981 B2 * | 9/2013 | Huang et al. | 96/6 |
| 8,747,521 B2 | 6/2014 | Sano | |
| 2006/0147698 A1 | 7/2006 | Carroll et al. | |
| 2010/0024898 A1 | 2/2010 | Bansal et al. | |
| 2012/0114902 A1 * | 5/2012 | Furuyama et al. | 428/137 |
| 2012/0297976 A1 | 11/2012 | Sano | |
| 2013/0087042 A1 * | 4/2013 | Furuyama et al. | 95/47 |
| 2013/0192460 A1 * | 8/2013 | Miller et al. | 95/47 |
| 2013/0296825 A1 | 11/2013 | Lerner | |
| 2013/0333978 A1 * | 12/2013 | Abe et al. | 181/291 |
| 2014/0038171 A1 | 2/2014 | Metzger | |

FOREIGN PATENT DOCUMENTS

| | | |
|---|---|---|
| JP | 2-167700 | 6/1990 |
| JP | 4-154573 | 5/1992 |
| JP | 5-086216 | 4/1993 |
| JP | 9-132667 | 5/1997 |
| JP | 2002-035558 | 2/2002 |
| JP | 2005-179562 | 7/2005 |
| JP | 2005-250268 | 9/2005 |
| JP | 2005-266004 | 9/2005 |
| JP | 2006-075648 | 3/2006 |
| JP | 2008-237949 | 10/2008 |
| JP | 2009-007439 | 1/2009 |
| JP | 2009-051872 | 3/2009 |

* cited by examiner

WATER-PROOF AIR-PERMEABLE FILTER AND USE OF THE SAME

This application is a U.S. national stage application of International Patent Application No. PCT/JP2011/001698, filed Mar. 23, 2011.

TECHNICAL FIELD

The present invention relates to a water-proof air-permeable filter to be attached to, for example, a housing, and relates to use of the water-proof air-permeable filter.

BACKGROUND ART

Conventionally, in, for example, automobile electric components such as automobile ECUs (Electrical Control Units), motors, lamps, and sensors, household electric appliances such as electric toothbrushes, shavers, and cellular phones, and solar cells, an opening is provided in a housing that accommodates an electronic component, a control board, etc., in order to eliminate a pressure difference between the inside and outside of the housing, and the opening is covered with a water-proof air-permeable filter. This water-proof air-permeable filter ensures ventilation between the inside and outside of the housing and also prevents foreign matters such as water and dust from entering the housing.

For such a water-proof air-permeable filter, a polytetrafluoroethylene (PTFE) porous membrane having favorable air permeability and high water pressure resistance is commonly used (for example, see Patent Literature 1). Generally, a PTFE porous membrane can be obtained by molding PTFE fine powder into a sheet shape and then stretching the sheet-shaped molded body in two directions orthogonal to each other.

CITATION LIST

Patent Literature

PTL 1: JP 2008-237949 A

SUMMARY OF INVENTION

Technical Problem

A PTFE porous membrane has an intricate porous structure composed of fibrils and nodes, and also has non-uniform pore diameters. Therefore, a water-proof air-permeable filter using a PTFE porous membrane has variation in air permeability, and when the degree of air permeation is measured, the degree of air permeation varies depending on the parts of the water-proof air-permeable filter. Accordingly, measures, such as increasing the area of the water-proof air-permeable filter, are taken in some cases to achieve stable quality of the water-proof air-permeable filter.

In view of the above circumstances, an object of the present invention is to provide a water-proof air-permeable filter that has stable air permeability, and use of the water-proof air-permeable filter.

Solution to Problem

In order to solve the above problem, the present invention provides a water-proof air-permeable filter for ensuring ventilation and also preventing entry of water, the water-proof air-permeable filter comprising: a non-porous resin film having formed therein a plurality of through pores extending through the resin film in a thickness direction; and a treated layer having hydrophobicity and oil repellency, and formed on at least one of both surfaces in the thickness direction of the resin film such that the treated layer has openings at positions corresponding to the plurality of through pores. The plurality of through pores each have a predetermined size larger than or equal to 0.01 µm and smaller than or equal to 10 µm, and are uniformly distributed such that a density of the plurality of through pores falls within specific limits included in a range from 10 to $1 \times 10^8$ pores/mm$^2$.

Here, the "size" of the through pore means the diameter of a circle having an area equal to the cross-sectional area of the through pore.

In addition, the present invention provides use of a water-proof air-permeable filter, the use comprising using the above-described water-proof air-permeable filter to cover an opening provided in a housing, and eliminate a pressure difference between the inside and outside of the housing via the water-proof air-permeable filter.

Advantageous Effects of Invention

With the above features, ventilation is allowed by the through pores formed in the resin film, and waterproofness can also be ensured by the treated layer on the resin film. Furthermore, since the through pores each have the predetermined size and are uniformly distributed, air permeability can be evenly imparted to the entire water-proof air-permeable filter.

DESCRIPTION OF EMBODIMENT

Hereinafter, an embodiment of the present invention will be described with reference to the accompanying drawings.

Figure 1:
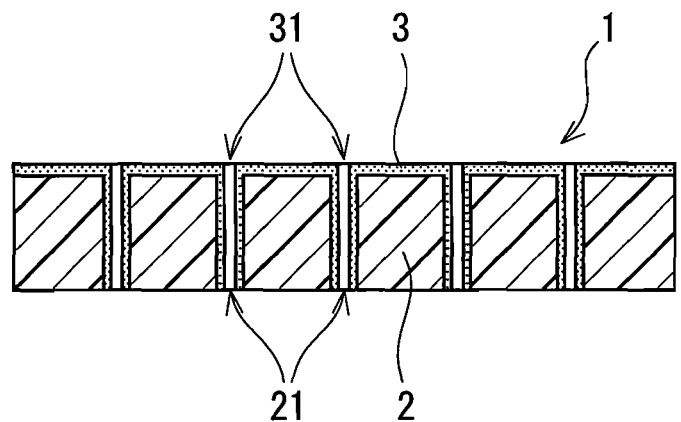
FIG. 1 is a schematic cross-sectional view of a water-proof air-permeable filter according to one embodiment of the present invention.

FIG. 1 shows a water-proof air-permeable filter 1 according to an embodiment of the present invention. The water-proof air-permeable filter 1 is for ensuring ventilation and also preventing entry of water. For example, the water-proof air-permeable filter 1 is attached to a housing (not shown) so as to cover an opening provided in the housing, and is used for eliminating a pressure difference between the inside and outside of the housing via the water-proof air-permeable filter 1.

Specifically, the water-proof air-permeable filter 1 includes a non-porous resin film 2 and a treated layer 3 formed on the resin film 2. As used herein, the term "non-porous" means having a solid inside that is filled with a resin.

In the resin film 2, a plurality of through pores 21 extending through the resin film 2 in the thickness direction are formed. In other words, the through pores 21 are open at both surfaces in the thickness direction of the resin film 2. Typically, the through pores 21 are straight pores having a given cross-sectional shape and extending linearly through the resin film 2. Such through pores can be formed by, for example, ion beam irradiation and etching. By use of ion beam irradiation and etching, through pores that have uniform sizes and axial directions can be formed in the resin film 2.

The cross-sectional shape of the through pores 21 is not particularly limited, and may be circular, or may be an undefined shape. In addition, the axial directions of the through pores 21 need not be a direction perpendicular to both surfaces in the thickness direction of the resin film 2, and may tilt relative to the direction.

The through pores 21 each have a predetermined size greater than or equal to 0.01 μm and smaller than or equal to 10 μm. The sizes of the through pores 21 need not be exactly the same among all the through pores 21, and it is sufficient that the through pores 21 have such sizes as can be considered to be substantially the same among all the through pores 21 (for example, the standard deviation is 10% or less of the average value). The sizes of the through pores 21 can be adjusted by etching time or the concentration of an etching treatment liquid. Preferably, the size of each through pore 21 is 0.5 μm or more and 5 μm or less.

In addition, the through pores 21 are uniformly distributed over the entire resin film 2 such that the density of the through pores 21 falls within specific limits included in a range from 10 to $1 \times 10^8$ pores/mm² (for example, such that the maximum density is smaller than or equal to 1.5 times of the minimum density). The density of the through pores 21 can be adjusted by the amount of ion irradiation at the time of ion beam irradiation. Preferably, the density of the through pores 21 is $1 \times 10^3$ to $1 \times 10^7$ pores/mm².

The porosity of the resin film 2 (the proportion of the sum of the cross-sectional areas of all the through pores 21 to the area defined by the outline of the resin film 2) is not particularly limited. In view of ensuring a film strength sufficient for the intended use, the porosity is preferably 50% or less, and more preferably 35% or less.

In addition, the thickness of the resin film 2 is not particularly limited. In order to realize a structure that has small pore diameters (high water pressure resistance) and a high porosity (high air permeability) (in order to form pores of small diameters even when a thick base material is used), the ratio of the thickness of the resin film 2 to the predetermined size (T/D when the predetermined size is defined as D and the thickness of the resin film is defined as T) is preferably 1 or more and 10000 or less, and more preferably 5 or more and 1000 or less.

The material of the resin film 2 is not particularly limited. Resins that can be decomposed by an alkali solution, an oxidant solution, or an alkali solution containing an oxidant are preferred. For example, the resin film 2 is made of at least one resin selected from polyethylene terephthalate (PET), polycarbonate (PC), polyimide (PI), polyethylene naphthalate (PEN), and polyvinylidene fluoride (PVdF).

An etching treatment liquid such as an alkali solution and an oxidant solution, which is appropriate for the material of the resin film 2, is used for the aforementioned etching for forming the through pores 21. For example, alkali solutions, such as potassium hydroxide and sodium hydroxide, can be used as a solution for hydrolyzing the resin. In addition, for example, oxidant solutions, such as a chlorous acid aqueous solution, a hypochlorous acid aqueous solution, a hydrogen peroxide solution, and a potassium permanganate solution, can be used as a solution for oxidatively decomposing the resin. For example, when the resin film 2 is formed of any of PET, PEN, and PC, a solution containing sodium hydroxide as the main component is used as the etching treatment liquid, and when the resin film 2 is formed of PI, a solution containing sodium hypochlorite as the main component is used as the etching treatment liquid. Furthermore, when the resin film 2 is formed of PVdF, a solution obtained by adding potassium permanganate to a solution containing sodium hydroxide as the main component is used as the etching treatment liquid to decompose PVdF.

Alternatively, a membrane filter sold by Oxyphen AG or Millipore Corporation can be used as the resin film 2 in which the through pores 21 are formed.

The resin film 2 may not necessarily consist of a single layer, and may consist of a plurality of separate layers.

In FIG. 1, the treated layer 3 is formed on one of both surfaces in the thickness direction of the resin film 2. However, the treated layer 3 may be formed on both surfaces of the resin film 2. That is, it is sufficient that the treated layer 3 is formed on at least one of both surfaces in the thickness direction of the resin film 2.

Specifically, the treated layer 3 is formed in such a manner as to have openings 31 at positions corresponding to the through pores 21, and has hydrophobicity and oil repellency. Such a treated layer 3 can be formed by applying a hydrophobic oil repellent agent thinly onto the resin film 2 and drying the agent. Examples of such an oil repellent agent include fluorine-based coating agents having a perfluoroalkyl group. The thickness of the treated layer 3 is preferably smaller than half of the above-described predetermined size of the through pores 21.

If an oil repellent agent is applied and dried on the resin film 2 in which the through pores 21 are formed as described above, the inner circumferential surfaces of the through pores 21 can also be coated with a second treated layer continuous with the treated layer 3. In this case, the sizes of the openings 31 of the treated layer 3 are smaller than the sizes of the through pores 21 by the thickness of the second treated layer.

Figure 2:
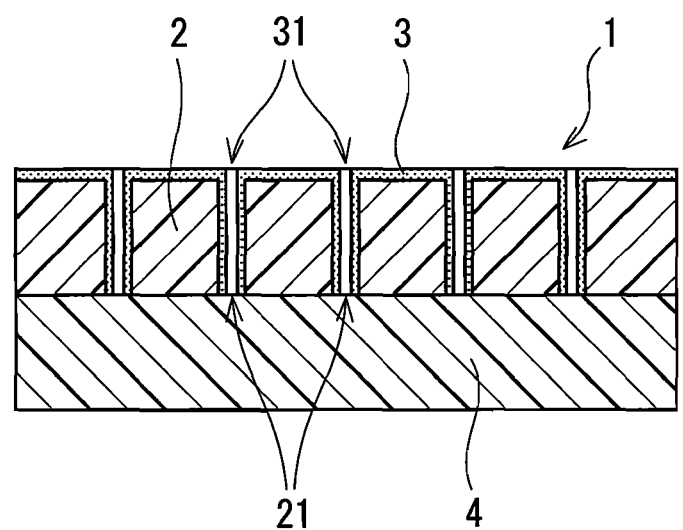
FIG. 2 is a schematic cross-sectional view of a water-proof air-permeable filter according to another embodiment of the present invention.

For example, as shown in FIG. 2, an air-permeable supporting member 4 may be laminated to the resin film 2. The air-permeable supporting member 4 may be laminated to the surface of the resin film 2 on which the treated layer 3 is not formed as shown in FIG. 2, or may be laminated to the surface of the resin film 2 on which the treated layer 3 is formed, with the treated layer 3 interposed therebetween. In addition, the air-permeable supporting member 4 may be laminated not only to one surface of the resin film 2 but also to the other surface. The air-permeable supporting member 4 preferably has better air permeability than the resin film 2. For example, a woven fabric, a nonwoven fabric, a net, a mesh, or the like, can be used as the air-permeable supporting member 4. In addition, examples of the material of the air-permeable supporting member 4 include polyester, polyethylene, and aramid resins.

The resin film 2 and the air-permeable supporting member 4 are joined by a common method such as heat welding and bonding using an adhesive agent. The resin film 2 and the air-permeable supporting member 4 are partially joined, and the area of the joined parts is preferably 5 to 20% of the entire area. This is because when the area of the joined parts is less than 5% of the entire area, the resin film 2 and the air-permeable supporting member 4 are likely to separate from each other, whereas when the area of the joined parts is more than 20%, the water pressure resistance at the joined parts is reduced. Preferably, the joined parts are distributed evenly over the entire area.

The water pressure resistance of the water-proof air-permeable filter 1 having the above features, which is measured in accordance with JIS L1092-A (low water pressure method) or JIS L1092-B (high water pressure method), is preferably 1 kPa or more and 1000 kPa or less.

The water-proof air-permeable filter 1 of the present embodiment allows ventilation by the through pores 21 formed in the resin film 2, and can also ensure waterproofness by the treated layer 3 on the resin film 2. Furthermore, since the through pores 21 each have the predetermined size and are uniformly distributed, air permeability can be evenly imparted to the entire water-proof air-permeable filter 1.

In conventional water-proof air-permeable filters using PTFE porous membranes, a plurality of PTFE porous membranes are laminated in order to increase the thickness in some cases. In this case, water may leak from an interface between the PTFE porous membranes during pressure resistance test due to a pressure lower than the water pressure that each single PTFE porous membrane can withstand. By contrast, in the case of the water-proof air-permeable film 1 of the present embodiment, it is sufficient to use a thick resin film 2 in order to increase the thickness. Accordingly, no problem occurs during water pressure resistance test. In order to form the through pores 21 in the thick resin film 2, it is sufficient to irradiate the resin film 2 with heavy ions at a high acceleration and a high density at the time of ion beam irradiation.

Furthermore, since PTFE porous membranes are made porous by stretching, a water-proof air-permeable filter using a PTFE porous membrane has a low tensile strength. By contrast, the water-proof air-permeable filter 1 of the present embodiment is not stretched, and thus has a high tensile strength. That is, according to the water-proof air-permeable filter 1 of the present embodiment, improvement in processability and resistance against external force can be expected.

In addition, with the features of the present embodiment, when the air-permeable supporting member 4 is used, the resin film 2 that is made of the same material as the air-permeable supporting member 4 can be used. Therefore, for example, the adhesion between the air-permeable supporting member 4 and the resin film 2 can be enhanced by improving compatibility at the time of thermal lamination.

EXAMPLES

Hereinafter, the present invention will be described in detail using examples. However, the present invention is not restricted by the examples to any degree.

Example 1

A sample A of 22 μm thickness (Oxydisk manufactured by Oxyphen AG), which is produced by forming circular through pores with a diameter of 0.8 μm in a non-porous base sheet of PET by means of ion beam irradiation and etching, was used as a resin film.

The degree of air permeation of the sample A was measured at 20 spots in accordance with JIS P8117. The result showed that the degree of air permeation (Gurley number) of the sample A was 2.7 seconds/100 mL on average, and the standard deviation was 0.169 seconds/100 mL.

In addition, a microscope photograph of one surface of the sample A was taken, and the density of the through pores in the sample A was measured at 10 spots by counting the number of pores per given area. The result showed that the density of the through pores was $3.6 \times 10^5$ to $5.5 \times 10^5$ pores/$mm^2$.

A nonwoven fabric made of PET was laminated as an air-permeable supporting member to one surface of the sample A which is a resin film by heat welding, and then a fluorine-based treatment agent (X-70-029C manufactured by Shin-Etsu Chemical Co., Ltd.) was applied to the other surface of the resin film and was dried, to form a treated layer having hydrophobicity and oil repellency. The thickness of the treated layer was 0.1 μm. In the above manner, a water-proof air permeable filter was obtained.

Example 2

A water-proof air-permeable filter was obtained in the same manner as in Example 1 except that a sample B of 20 μm thickness (Oxydisk manufactured by Oxyphen AG), which is produced by forming through pores with a diameter of 3.0 μm in a non-porous base sheet of PET by means of ion beam irradiation and etching, was used as a resin film.

The degree of air permeation of the sample B was measured at 20 spots in accordance with JIS P8117. The result showed that the degree of air permeation (Gurley number) of the sample B was 1.1 seconds/100 mL on average, and the standard deviation was 0.035 seconds/100 mL.

In addition, a microscope photograph of one surface of the sample B was taken, and the density of the through pores in the sample B was measured at 10 spots by counting the number of pores per given area. The result showed that the density of the through pores was $7.0 \times 10^3$ to $9.5 \times 10^3$ pores/$mm^2$.

Comparative Example 1

A water-proof air-permeable filter was obtained in the same manner as in Example 1 except that a PTFE porous membrane A having a thickness of 20 μm and an average pore diameter of 0.5 μm was used instead of a resin film. The PTFE porous membrane A was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 5 in the longitudinal direction and by a factor of 8 in the lateral direction at 380° C. which is higher than or equal to the melting point of PTFE.

The degree of air permeation of the PTFE porous membrane A was measured at 20 spots in accordance with JIS P8117. The result showed that the degree of air permeation (Gurley number) of the PTFE porous membrane A was 11.9 seconds/100 mL on average, and the standard deviation was 3.450 seconds/100 mL.

Comparative Example 2

A water-proof air-permeable filter was obtained in the same manner as in Example 1 except that a PTFE porous membrane B having a thickness of 20 μm and an average pore diameter of 0.8 μm was used instead of a resin film. The PTFE porous membrane B was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 4.5 in the longitudinal direction and by a factor of 15 in the lateral direction at 280° C. which is lower than or equal to the melting point of PTFE.

The degree of air permeation of the PTFE porous membrane B was measured at 20 spots in accordance with JIS P8117. The result showed that the degree of air permeation (Gurley number) of the PTFE porous membrane A was 1.1 seconds/100 mL on average, and the standard deviation was 0.167 seconds/100 mL.

Comparative Example 3

A water-proof air-permeable filter was obtained in the same manner as in Example 1 except that a PTFE porous membrane C having a thickness of 70 µm and an average pore diameter of 3.0 µm was used instead of a resin film. The PTFE porous membrane C was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 10 in the longitudinal direction and by a factor of 8 in the lateral direction at 380° C. which is higher than or equal to the melting point of PTFE.

The degree of air permeation of the PTFE porous membrane C was measured at 20 spots in accordance with JIS P8117. The result showed that the degree of air permeation (Gurley number) of the PTFE porous membrane C was 1.7 seconds/100 mL on average, and the standard deviation was 0.263 seconds/100 mL.

Test

The degree of air permeation of each of the water-proof air-permeable filters of Examples and Comparative Examples was measured at 20 spots in accordance with JIS P8117, and the average value and the standard deviation were calculated. Furthermore, the standard deviation was divided by the average value, and the resultant value was multiplied by 100 to calculate the degree of variability.

In addition, the water pressure resistance of each of the water-proof air-permeable filters of Examples and Comparative Examples was measured in accordance with JIS L1092. The results are shown in Table 1.

TABLE 1

| | Degree of air permeation | | | | |
|---|---|---|---|---|---|
| | Average value (sec/100 mL) | Standard deviation (sec/100 mL) | Degree of variability (%) | Water pressure resistance (kPa) | (Average) pore diameter (µm) |
| Example 1 | 3.7 | 0.284 | 7.7 | 120 | 0.8 |
| Example 2 | 1.5 | 0.059 | 3.8 | 20 | 3.0 |
| Com. Example 1 | 41.7 | 11.287 | 27.1 | 250 | 0.5 |
| Com. Example 2 | 5.9 | 1.131 | 19.2 | 140 | 0.8 |
| Com. Example 3 | 2.6 | 0.421 | 16.5 | 30 | 3.0 |

It is understood from Table 1 that the water-proof air-permeable filters of Examples, for which resin films having formed therein through pores were used, have a smaller degree of variability than that of the water-proof air-permeable filters of Comparative Examples for which PTFE porous membranes were used. Furthermore, the water-proof air-permeable filters of Examples also have higher water pressure resistance.

INDUSTRIAL APPLICABILITY

The water-proof air-permeable filter of the present invention is applicable to, for example, outdoor lamps such as outside lights, and lamps for electric trains etc., as well as automobile electric components, household electric appliances, and solar cells.

The invention claimed is:

1. A water-proof air-permeable filter for ensuring ventilation and also preventing entry of water, the water-proof air-permeable filter comprising:

a non-porous resin film having formed therein a plurality of through pores extending through the resin film in a thickness direction; and a treated layer having hydrophobicity and oil repellency, and formed on at least one of both surfaces in the thickness direction of the resin film such that the treated layer has openings at positions corresponding to the plurality of through pores, wherein the plurality of the through pores each have a size larger than or equal to 0.01 µm and smaller than or equal to 10 µm, and the plurality of the through pores are uniformly distributed such that a density of the plurality of the through pores falls within a range from 10 to $1\times10^8$ pores/mm$^2$, the treated layer coats an inner surface of the through pores so as to form an inner part of the treated layer located inside the through pores, and a material forming the treated layer is different from a material forming the resin film.

2. The water-proof air-permeable filter according to claim 1, wherein a porosity of the resin film is 50% or less.

3. The water-proof air-permeable filter according to claim 1, wherein a ratio of a thickness of the resin film to the size of the plurality of the through pores is 1 or more and 10000 or less.

4. The water-proof air-permeable filter according to claim 1, wherein the resin film is made of a resin that is decomposed with at least one solution selected from the group consisting of an alkali solution, an oxidant solution, and an alkali solution containing an oxidant.

5. The water-proof air-permeable filter according to claim 4, wherein the resin is at least one material selected from the group consisting of polyethylene terephthalate, polycarbonate, polyimide, polyethylene naphthalate, and polyvinylidene fluoride.

6. The water-proof air-permeable filter according to claim 1, further comprising an air-permeable supporting member laminated to the resin film.

7. The water-proof air-permeable filter according to claim 1, wherein a water pressure resistance measured according to JIS L1092-A (low water pressure method) or JIS L1092-B (high water pressure method) is 1 kPa or more and 1000 kPa or less.

8. A method of closing an opening of a housing, comprising applying the water-proof air-permeable filter according to claim 1 so as to cover the opening of the housing and to eliminate a pressure difference between inside of the housing and outside of the housing via the water-proof air-permeable filter.

9. The water-proof air-permeable filter according to claim 1, wherein the treated layer has a higher waterproof property than a waterproof property of the resin film.

10. The water-proof air-permeable filter according to claim 1, wherein the resin film is made of at least one resin selected from the group consisting of polyethylene terephthalate, polyimide, and polyethylene naphthalate.

11. The water-proof air-permeable filter according to claim 10, wherein the treated layer is formed of a fluorine-based agent by applying the fluorine-based agent to the non-porous resin film having the through pores and drying the fluorine-based agent.

12. The water-proof air-permeable filter according to claim 1, wherein the through pores are straight pores extending linearly through the resin film when viewed in a cross-section of the resin film, and a size of the opening of the treated layer is smaller than a size of an opening of the respective through pore corresponding to the opening of the treated layer by a thickness of the inner part of the treated layer when viewed in the thickness direction of the resin film.

\* \* \* \* \*